United States Patent
Shang et al.

(10) Patent No.: US 12,538,478 B2
(45) Date of Patent: Jan. 27, 2026

(54) SEMICONDUCTOR MEMORY DEVICE AND MANUFACTURING METHOD THEREOF

(71) Applicant: NANYA TECHNOLOGY CORPORATION, New Taipei (TW)

(72) Inventors: Kai-Po Shang, Taichung (TW); Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 376 days.

(21) Appl. No.: 18/205,094

(22) Filed: Jun. 2, 2023

(65) Prior Publication Data
US 2024/0407156 A1 Dec. 5, 2024

(51) Int. Cl.
*H10B 12/00* (2023.01)

(52) U.S. Cl.
CPC ........... *H10B 12/485* (2023.02); *H10B 12/01* (2023.02); *H10B 12/02* (2023.02); *H10B 12/482* (2023.02)

(58) Field of Classification Search
CPC .... H10B 12/485; H10B 12/02; H10B 12/482; H10B 12/01
See application file for complete search history.

(56) References Cited

U.S. PATENT DOCUMENTS

| | | | |
|---|---|---|---|
| 2005/0266678 A1 | 12/2005 | Helm et al. | |
| 2007/0267691 A1* | 11/2007 | Chen | H10D 30/608 |
| | | | 257/E29.267 |
| 2013/0288472 A1* | 10/2013 | Choi | H10D 64/513 |
| | | | 438/587 |
| 2013/0320558 A1* | 12/2013 | Kim | H10B 12/482 |
| | | | 257/E21.585 |
| 2015/0340453 A1* | 11/2015 | Cho | H10B 12/482 |
| | | | 257/330 |
| 2023/0187219 A1* | 6/2023 | Zhu | H01L 21/0337 |
| | | | 438/488 |
| 2023/0328969 A1* | 10/2023 | Yan | H10D 84/038 |
| 2024/0008248 A1* | 1/2024 | Liu | H10B 12/0335 |

FOREIGN PATENT DOCUMENTS

TW 202301677 A 1/2023

* cited by examiner

*Primary Examiner* — David Vu
*Assistant Examiner* — Brandon C Fox
(74) *Attorney, Agent, or Firm* — CKC & Partners Co., LLC

(57) ABSTRACT

A semiconductor memory device includes a substrate with an active area, a bit line contact in contact with the active area, and a bit line having an end portion in contact with the bit line contact, wherein the end portion has a first trapezoidal profile. A semiconductor memory device manufacturing method is also disclosed to utilize a vertical etching process which has an etching recipe to have higher conductive material/barrier layer selectivity, thereby enlarging bit line contact to active area landing area and improving a contact resistance of the bit line contact.

14 Claims, 6 Drawing Sheets

SEMICONDUCTOR MEMORY DEVICE AND MANUFACTURING METHOD THEREOF

BACKGROUND

Field of Disclosure

The present disclosure relates to a semiconductor memory device and manufacturing method thereof.

Description of Related Art

An integrated circuit (IC) device (also referred to as a semiconductor chip) can contain millions of transistors and other circuit elements that are fabricated on a single silicon crystal substrate (wafer). In recent years, as DRAM technology node continued to scale down, the conductive structures in DRAM devices are becoming closer and smaller. Device contact resistances are increases, which will decrease the device's on-current and the operation speed of the DRAM devices.

SUMMARY

The present disclosure provides semiconductor memory device manufacturing methods to deal with the needs of the prior art problems.

In one or more embodiments, a semiconductor memory device includes a substrate with an active area; a bit line contact in contact with the active area; and a bit line having an end portion in contact with the bit line contact, wherein the end portion has a first trapezoidal profile.

In one or more embodiments, the end portion of the bit line comprises a metal conductive portion and at least one barrier layer.

In one or more embodiments, the end portion of the bit line includes a tungsten portion, a tungsten nitride layer and a titanium nitride layer.

In one or more embodiments, the bit line contact has a second trapezoidal profile.

In one or more embodiments, the first trapezoidal profile and the second trapezoidal profile share a common edge.

In one or more embodiments, the bit line contact includes polysilicon.

In one or more embodiments, the active area includes p-type implanted dopants or n-type implanted dopants.

In one or more embodiments, a semiconductor memory device manufacturing method comprising: providing a substrate with an active area; forming a bit line contact in the active area: forming a bit line having an end portion in contact with the bit line contact, wherein the end portion of the bit line includes a metal conductive portion and at least one barrier layer; and etching the bit line and the bit line contact by an etching recipe that has a higher etching rate to the metal conductive portion and a lower etching rate to the at least one barrier layer.

In one or more embodiments, the bit line includes tungsten.

In one or more embodiments, the bit line contact includes polysilicon.

In one or more embodiments, at least one barrier layer includes titanium nitride.

In one or more embodiments, at least one barrier layer includes tungsten silicide.

In one or more embodiments, the end portion of the bit line further includes an adhesion layer sandwiched between the metal conductive portion and the at least one barrier layer.

In one or more embodiments, the adhesion layer includes tungsten nitride.

In one or more embodiments, etching the bit line and the bit line contact includes using a carbon layer and a nitride layer as a mask to etch and define patterns.

In sum, the semiconductor memory device manufacturing method disclosed herein utilizes a vertical etching process which has an etching recipe to have higher conductive material/barrier layer selectivity, thereby enlarging bit line contact (BC) to active area (AA) landing area and improving a contact resistance of the bit line contact (BC).

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
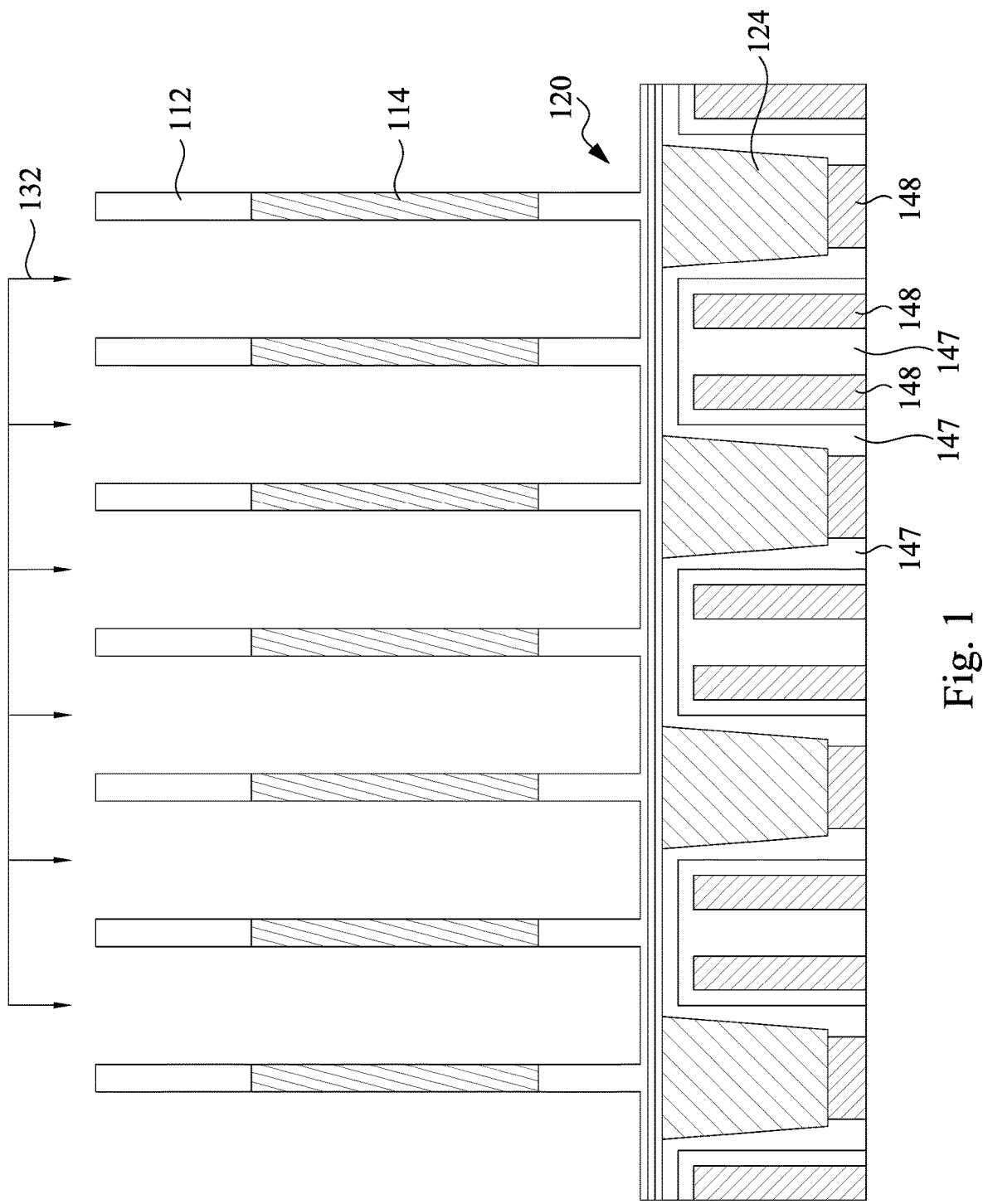
FIG. 1 illustrates a cross-sectional view of one step of a semiconductor memory manufacturing process according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
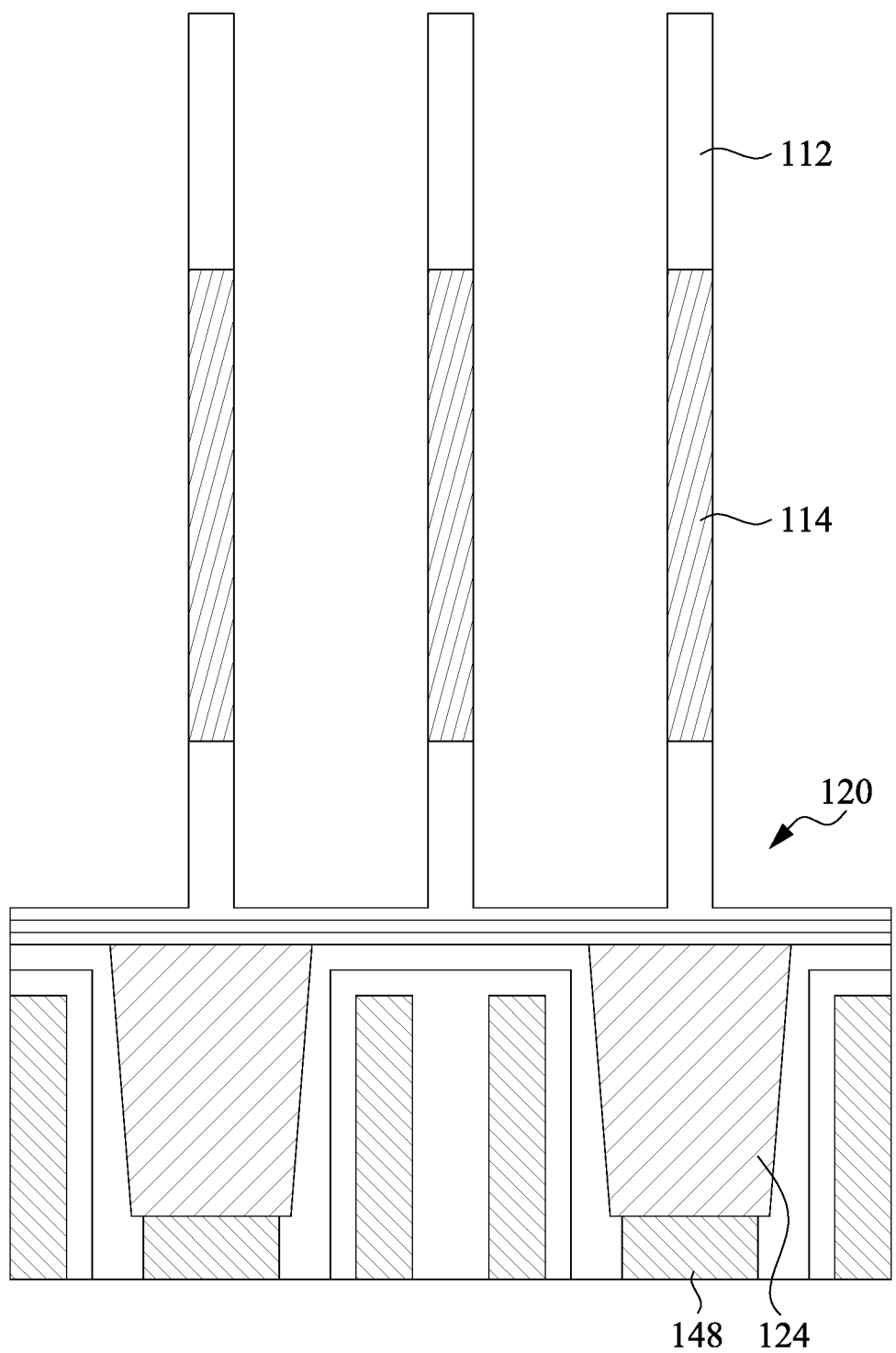
FIG. 2 illustrates an enlarged cross-sectional view of a partial portion in FIG. 1.

Reference is made to FIGS. 1 and 2, FIG. 1 illustrates a cross-sectional view of one step of a semiconductor memory manufacturing process according to some embodiments of the present disclosure, and FIG. 2 illustrates an enlarged cross-sectional view of a partial portion in FIG. 1. The cross-sectional view illustrates a portion of a memory array including bit line structures. A semiconductor substrate is processed to form active areas 148. Several steps are typically involved in semiconductor processing. A suitable semiconductor substrate, such as silicon (Si), is chosen based on the desired device specifications and requirements. A thin layer of silicon dioxide ($SiO_2$) may be on the surface of the substrate. This can be achieved through thermal oxidation, where the substrate is exposed to an oxygen-rich environment at high temperatures, or by using deposition techniques such as chemical vapor deposition (CVD) or plasma-enhanced chemical vapor deposition (PECVD). A layer of photosensitive material, known as photoresist, is coated onto the oxide layer. Then, expose the photoresist to ultraviolet (UV) light through a photomask containing the desired pattern. This step transfers the pattern onto the photoresist. The exposed photoresist is developed using a suitable developer solution. This selectively removes either the exposed (positive photoresist) or unexposed (negative photoresist) regions of the photoresist, leaving behind the desired pattern. An etching process, such as plasma etching or wet etching, is used to selectively remove the exposed oxide layer where the active area will be formed. The patterned photoresist acts as a mask, protecting the regions where the oxide is desired. Ion implantation is performed to introduce p-type or n-type dopant atoms into the exposed semiconductor substrate regions where the active devices will be formed. The dopants modify the electrical properties of the substrate, creating regions with desired conductivity characteristics. The implanted dopants are activated and crystal lattice damage caused by the implantation process is repaired through an annealing process. This step typically involves subjecting the substrate to high temperatures for a specific duration.

Isolation regions 147 are also formed between adjacent active areas 148 to achieve electrical isolation. Isolation regions 147 can be formed by a series of steps such as trench formation, etching, liner deposition, trench fill, and planarization etc. A trench pattern is created on the wafer surface using lithography techniques. The pattern defines the location and dimensions of the isolation trenches. A masking material, such as photoresist, is applied and exposed to ultraviolet (UV) light through a mask, followed by development to form a photoresist pattern. The exposed silicon dioxide ($SiO_2$) areas are etched away using a dry or wet etching process, forming the trenches. A thin layer of oxide, called a liner, is deposited on the sidewalls and the bottom of the trenches. The liner material is usually silicon dioxide ($SiO_2$) or another suitable dielectric material. The liner helps improve the electrical isolation and prevents contaminants from diffusing into the active areas. The trenches are filled with a dielectric material, such as chemical vapor deposition (CVD) oxide or a combination of oxide and other materials like silicon nitride ($Si_3N_4$). The excess fill material is typically removed using a chemical mechanical planarization (CMP) process, which levels the wafer surface. The wafer surface is thus planarized to ensure a uniform and flat surface across the wafer, eliminating any irregularities or topographic variations caused by the trench filling process.

Bit line contacts 124 are formed on the active areas 148. In a semiconductor memory array, a bit line contact, also known as a bit line contact plug or simply a contact, is a crucial component that establishes an electrical connection between the bit line and the memory cell or transistor. It allows for the transmission of signals and data between the memory cells and the bit lines in the memory array. Bit line contacts 124 can be formed by a series of steps such as dielectric layer deposition, photolithography, etching, conductive material deposition and planarization etc. A dielectric layer may be deposited over a memory array region. This layer acts as an insulating material, providing electrical isolation between different components of the memory array. A layer of photosensitive material, known as photoresist, is applied onto the dielectric layer. Utilize photolithography techniques to define the locations where the bit line contacts will be formed. This is achieved by exposing the photoresist to ultraviolet (UV) light through a photomask containing the desired contact patterns. An etching process is used to remove the dielectric layer in the areas not protected by the photoresist. This creates openings or cavities where the bit line contacts will be formed. A conductive material, often a metal or a metal alloy, is deposited into the etched openings or cavities. This material will form the bit line contacts, establishing the electrical connection between the memory cells and the bit lines. In this embodiment, the conductive material is polysilicon. Planarization techniques, such as chemical mechanical polishing (CMP), is performed to remove excess conductive material and ensure a smooth, flat surface. This step helps to eliminate any topographical variations and ensure uniformity across the memory array.

Bit lines 120 are then formed on tops of the bit line contacts 124. In semiconductor memory devices, such as dynamic random access memory (DRAM) or static random access memory (SRAM), a bit line is an essential component used for reading and writing data. It is responsible for transferring data between the memory cell array and the peripheral circuitry. The bit line connects to one end of each memory cell within the memory array. During a read operation, the stored data in the memory cell is accessed and transferred through the bit line for further processing. During a write operation, data is driven onto the bit line to store it in the memory cell.

Hard mask layers 114 and 112 are formed above the bit lines 120. Hard mask layers 114 and 112 are protective layers used to define and transfer patterns onto underlying bit lines 120 during various etching processes 132. Hard mask layers 114 and 112 serve as a mask, providing resistance to etching chemicals, and helps to ensure precise pattern transfer and alignment. In some embodiments of the present disclosure, the hard mask layer 112 may be a carbon layer while the hard mask layer 114 may be a nitride layer.

Figure 3:
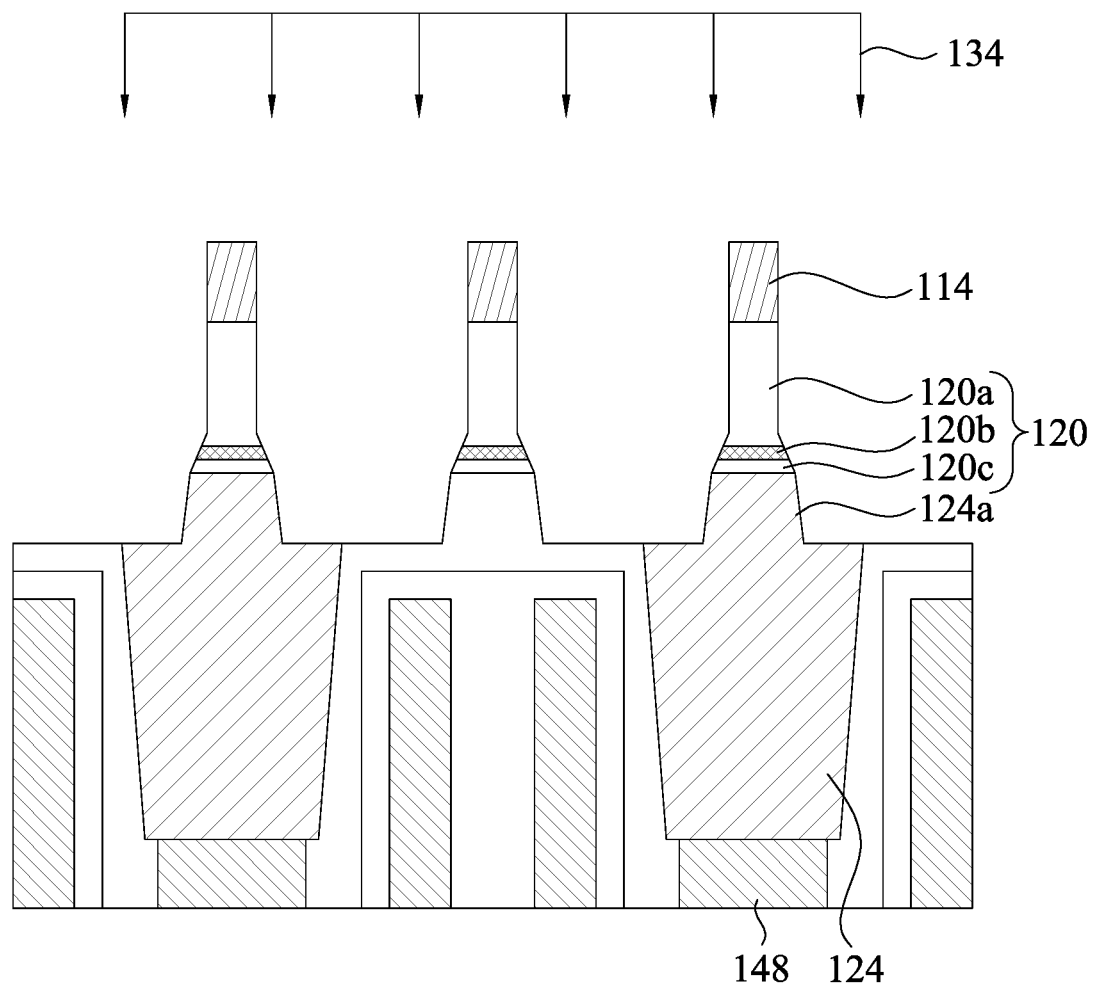
FIG. 3 illustrates a cross-sectional view of another process step following after the step in FIG. 2 according to some embodiments of the present disclosure.

Reference is made to FIG. 3, which illustrates a cross-sectional view of another process step following after the step in FIG. 2 according to some embodiments of the present disclosure. After an upper portion of each bit line 120 has been patterned, the hard mask layer 112 is stripped and another etch process 134 is used to pattern a lower portion of each bit line 120 and an upper portion 124*a* of each bit line contact 124. The lower (end) portion of each bit line 120 includes a tungsten (W) portion 120*a*, a tungsten nitride (WN) layer 120*b* and a titanium nitride (TiN) layer 120*c*. The etch process 134 has an etching recipe to have higher tungsten/titanium nitride selectivity. Etching selectivity in semiconductor processing refers to the difference in etching rates between two different materials. It measures how effectively one material can be etched while minimizing the etching of another material in a selective etching process. In some embodiments of the present disclosure, the etch process 134 has a higher etching rate to the tungsten portion 120*a* and a lower etching rate to the titanium nitride layer 120*c*. In some embodiments of the present disclosure, the etch process 134 may include fluorine-based chemistries, such as sulfur hexafluoride ($SF_6$) or carbon tetrafluoride ($CF_4$), which are commonly used to etch tungsten mixed with chlorine-based chemistries, such as chlorine gas ($Cl_2$) or hydrogen chloride (HCl), which are often used for etching titanium nitride. However, the selectivity between tungsten and titanium nitride can vary depending on the specific etching conditions, such as gas flow rates, pressure, power, and temperature. The etch process 134 is configured to pattern the lower portion of each bit line 120 to form an isosceles trapezoidal profile, wherein the isosceles trapezoidal profile has the tungsten portion 120*a* as its top edge and the titanium nitride (TiN) layer 120*c* as its bottom edge that is parallel to the top edge.

In some embodiments of the present disclosure, the tungsten nitride layer is employed as a diffusion barrier or an adhesion layer, and the titanium nitride layer serves as barrier layer to prevent tungsten from diffusing into adjacent layers or materials, e.g., bit line contact. Tungsten silicide ($WSi_2$) may also be used as a barrier layer for tungsten because it exhibits excellent thermal stability, good adhesion to underlying bit line contact, and compatibility with the tungsten deposition process.

Figure 4:
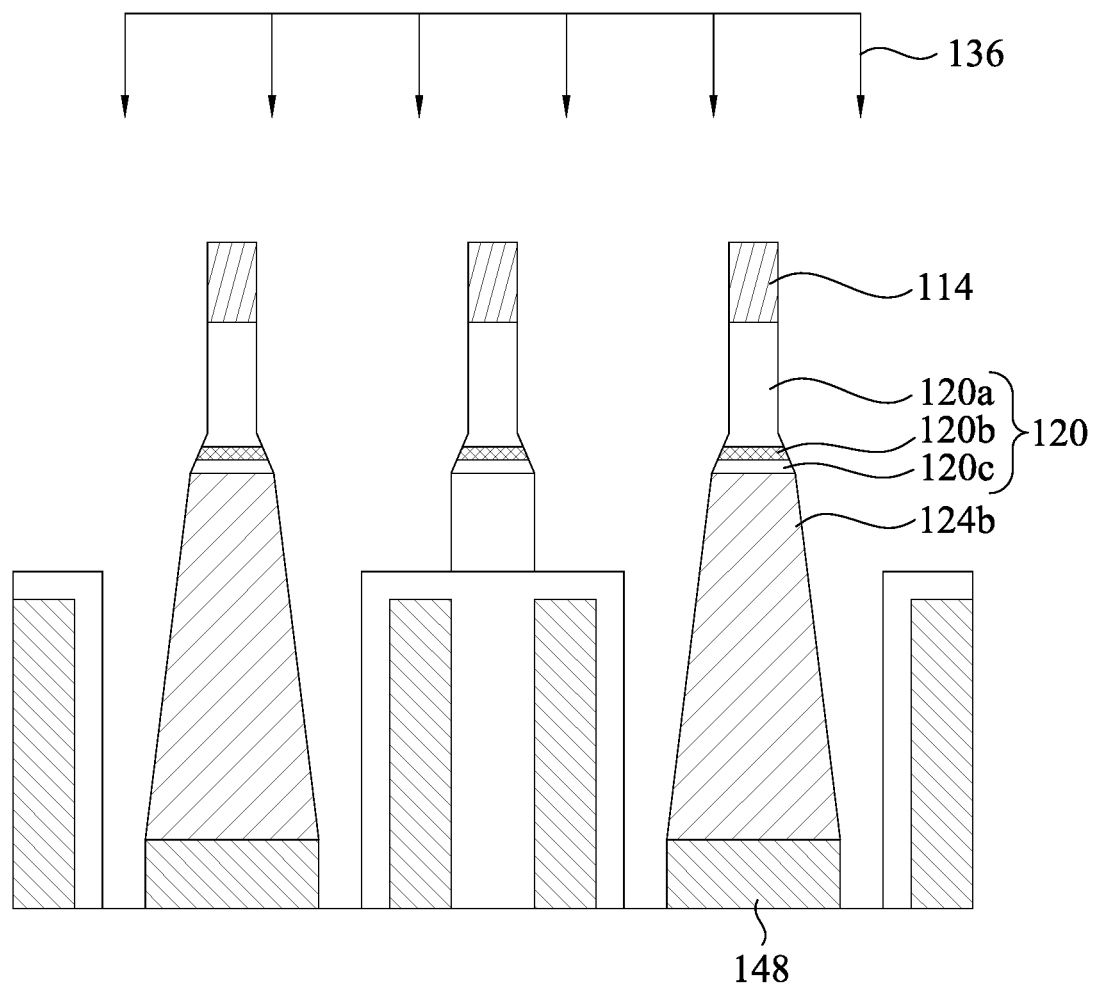
FIG. 4 illustrates a cross-sectional view of another process step following after the step in FIG. 3 according to some embodiments of the present disclosure.

Reference is made to FIG. 4, which illustrates a cross-sectional view of another process step following after the step in FIG. 3 according to some embodiments of the present disclosure. This cross-sectional view illustrates that each bit line contact 124 is etched to achieve the desired profile of the bit line contact 124b by a further etch process 136. The etch process 136 may have an etching recipe to have higher polysilicon/titanium nitride selectivity. In particular, the etch process 136 has a higher etching rate to the bit line contact 124b (i.e., polysilicon bit line contact) and a lower etching rate to the titanium nitride layer 120c. In some embodiments of the present disclosure, the etch process 136 may include chlorine-based plasma etching, bromine-based plasma etching and/or $SF_6$-based plasma etching, which are commonly used to etch polysilicon mixed with chlorine-based plasma etching, and/or fluorine-based plasma etching, nitric acid ($HNO_3$) wet etching, which are often used for etching titanium nitride. However, the selectivity between polysilicon and titanium nitride can vary depending on the specific etching conditions, such as gas flow rates, pressure, power, and temperature. The etch process 136 is configured to pattern the bit line contact 124b to form another isosceles trapezoidal profile, which is larger than the isosceles trapezoidal profile of the lower portion of the bit line 120. The larger isosceles trapezoidal profile has the titanium nitride (TiN) layer 120c as its top edge and an interface between the bit line contact 124b and the active area 148 as its bottom edge that is parallel to the top edge. The larger isosceles trapezoidal is in contact with the smaller isosceles trapezoidal profile (the lower portion of the bit line 120), and share a common edge (i.e., the titanium nitride layer 120c).

Figure 5:
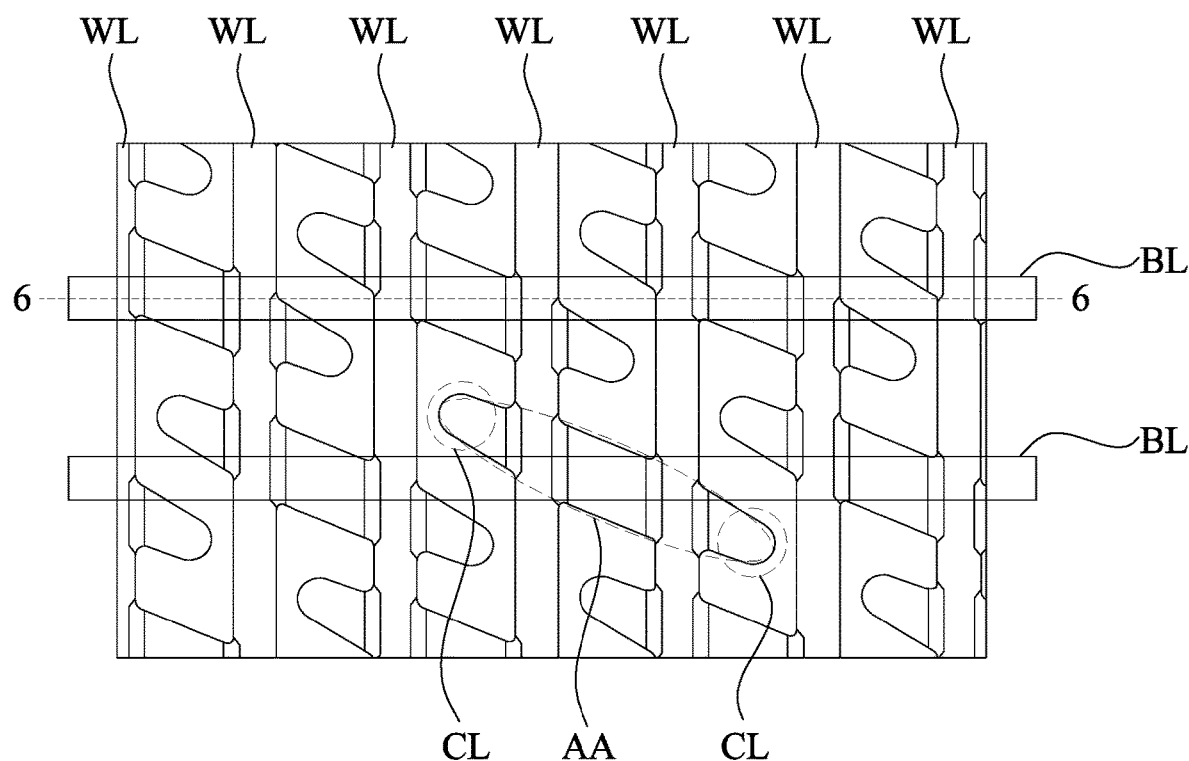
FIG. 5 illustrates a top view of a memory array according to some embodiments of the present disclosure.
Figure 6:
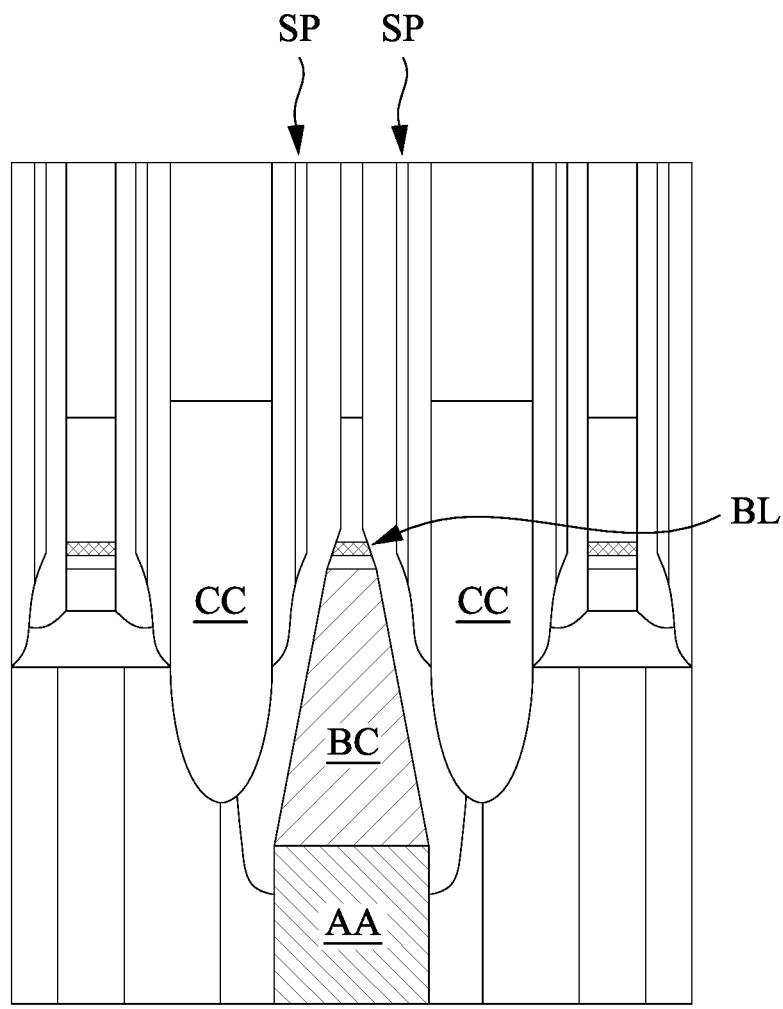
FIG. 6 illustrates a cross-sectional view taken along a line 6-6 in FIG. 5.

Reference is made to FIGS. 5 and 6, FIG. 5 illustrates a top view of a memory array according to some embodiments of the present disclosure, and FIG. 6 illustrates a cross-sectional view taken along a line 6-6 in FIG. 5. The top view illustrates the memory array including memory cells (CL), active areas (AA), bit lines (BL) and word lines (WL). Word lines, also known as row lines, are conductive lines in a memory array that connect to the control gates of memory cells within a specific row. Each word line corresponds to a row of memory cells. The word line is responsible for controlling the activation and access of the memory cells within its corresponding row. When a specific word line is selected, it enables the read or write operation on the memory cells in that row. By activating the appropriate word line, the desired row of memory cells can be accessed for data retrieval or modification. Bit lines, also known as column lines, are conductive lines in a memory array that connect to the bit or storage nodes of memory cells within a specific column. Each bit line corresponds to a column of memory cells. The bit line is responsible for carrying and sensing the data stored in the memory cells within its corresponding column. During a read operation, the state of the memory cells in a specific column is sensed through the connected bit line, allowing the retrieval of data stored in those cells. During a write operation, the bit line is used to provide the necessary electrical signals to modify the state of the memory cells in the selected column. In sum, word lines control the activation and access of memory cells in a row, while bit lines carry and sense the data stored in memory cells within a column.

The cross-sectional view illustrates a portion of a semiconductor memory device that includes a portion of a substrate (i.e., active areas 148), a bit line contact (BC), a bit line (BL) and cell contacts (CC). The bit line contact (BC) and the bit line (BL) are continuous and located between two adjacent cell contacts (CC). A sidewall spacer (SP) is sandwiched between adjacent bit line (BL) and cell contact (CC) to achieve an electrical isolation. A lower end portion of the bit line (BL) has a first trapezoidal profile, and the bit line contact (BC) has a second trapezoidal profile. Compared with a conventional bit line and bit line contact, the lower end portion of the bit line (BL) and the bit line contact (BC) has a wider profile, which enlarges an interface between the bit line contact (BC) and its corresponding active area (AA), thereby improving a contact resistance of the bit line contact (BC) by increasing the bit line contact (BC) to active area (AA) landing area.

In sum, the semiconductor memory device manufacturing method disclosed herein utilizes a vertical etching process which has an etching recipe to have higher conductive material/barrier layer selectivity, thereby enlarging bit line contact (BC) to active area (AA) landing area and improving a contact resistance of the bit line contact (BC).

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor memory device comprising:
   a substrate comprising an active area;
   a bit line contact in contact with the active area; and
   a bit line having an end portion in contact with the bit line contact, wherein the end portion of the bit line has a first trapezoidal profile, the bit line contact has a second trapezoidal profile, a second sidewall of the second trapezoidal profile has a slope steeper than that of a first sidewall of the first trapezoidal profile.

2. The semiconductor memory device of claim 1, wherein the end portion of the bit line comprises a metal conductive portion and at least one barrier layer.

3. The semiconductor memory device of claim 1, wherein the end portion of the bit line comprises a tungsten portion, a tungsten nitride layer and a titanium nitride layer.

4. The semiconductor memory device of claim 1, wherein the first trapezoidal profile and the second trapezoidal profile share a common edge.

5. The semiconductor memory device of claim 1, wherein the bit line contact comprises polysilicon.

6. The semiconductor memory device of claim 1, wherein the active area comprises p-type implanted dopants or n-type implanted dopants.

7. A semiconductor memory device manufacturing method comprising:
   providing a substrate with an active area;
   forming a bit line contact in the active area;
   forming a bit line having an end portion in contact with the bit line contact, wherein the end portion of the bit line comprises a metal conductive portion and at least one barrier layer; and
   etching the bit line and the bit line contact by an etching recipe that has a higher etching rate to the metal conductive portion and a lower etching rate to the at least one barrier layer, wherein the end portion of the bit line has a first trapezoidal profile, the bit line contact has a second trapezoidal profile, a second sidewall of the second trapezoidal profile has a slope steeper than that of a first sidewall of the first trapezoidal profile.

8. The method of claim 7, wherein the bit line comprises tungsten.

9. The method of claim 7, wherein the bit line contact comprises polysilicon.

10. The method of claim 7, wherein the at least one barrier layer comprises titanium nitride.

11. The method of claim 7, wherein the at least one barrier layer comprises tungsten silicide.

12. The method of claim 7, wherein the end portion of the bit line further comprises an adhesion layer sandwiched between the metal conductive portion and the at least one barrier layer.

13. The method of claim 12, wherein the adhesion layer comprises tungsten nitride.

14. The method of claim 7, wherein etching the bit line and the bit line contact comprises using a carbon layer and a nitride layer as a mask to etch and define patterns.

* * * * *